(12) United States Patent
Lin

(10) Patent No.: US 10,170,339 B2
(45) Date of Patent: Jan. 1, 2019

(54) SEMICONDUCTOR STRUCTURE AND A MANUFACTURING METHOD THEREOF

(71) Applicant: NANYA TECHNOLOGY CORPORATION, Taoyuan (TW)

(72) Inventor: Po Chun Lin, Changhua (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 15/333,933

(22) Filed: Oct. 25, 2016

(65) Prior Publication Data

US 2018/0114705 A1    Apr. 26, 2018

(51) Int. Cl.
   *H01L 23/31*   (2006.01)
   *H01L 21/56*   (2006.01)
   *H01L 23/28*   (2006.01)

(52) U.S. Cl.
   CPC ........ *H01L 21/565* (2013.01); *H01L 23/3114* (2013.01); *H01L 23/3121* (2013.01); *H01L 23/28* (2013.01); *H01L 23/31* (2013.01); *H01L 23/3107* (2013.01)

(58) Field of Classification Search
   CPC ... H01L 21/565; H01L 23/31; H01L 23/3114; H01L 23/3102; H01L 23/3121; H01L 23/3185
   USPC ............................. 264/272.11, 272.17, 272.13
   See application file for complete search history.

(56) References Cited

U.S. PATENT DOCUMENTS

| | | | |
|---|---|---|---|
| 6,224,936 B1 * | 5/2001 | Gochnour | H05K 3/284 427/282 |
| 6,512,301 B1 | 1/2003 | Palanisamy et al. | |
| 6,706,556 B2 | 3/2004 | Palanisamy et al. | |
| 6,969,641 B2 * | 11/2005 | Matsunami | H01L 21/565 257/E21.504 |
| 8,592,997 B2 | 11/2013 | Yu et al. | |
| 9,305,894 B2 * | 4/2016 | Blackshear | H01L 24/75 |
| 9,418,907 B2 * | 8/2016 | Usami | H01L 23/00 |
| 2001/0045643 A1 * | 11/2001 | Katoh | H01L 23/16 257/706 |
| 2010/0109151 A1 * | 5/2010 | Fujimura | H01L 23/3114 257/701 |
| 2012/0313262 A1 * | 12/2012 | Suzuki | H01L 23/3128 257/777 |
| 2013/0147054 A1 * | 6/2013 | Lin | H01L 24/96 257/774 |
| 2013/0260535 A1 | 10/2013 | Chen et al. | |

(Continued)

FOREIGN PATENT DOCUMENTS

| | | | | |
|---|---|---|---|---|
| JP | 5711020 A | * | 1/1982 | ............... B29C 6/00 |
| TW | 201037802 A | | 10/2010 | |
| TW | 201634630 A | | 10/2016 | |

*Primary Examiner* — David A Zarneke
(74) *Attorney, Agent, or Firm* — Muncy, Geissler, Olds & Lowe, P.C.

(57) ABSTRACT

A method of manufacturing a semiconductor structure includes providing a substrate and a chip disposed over the substrate; disposing the substrate over a first molding member; disposing a second molding member over the substrate to encapsulate the chip; disposing a molding material around the chip; forming a molding over the substrate and around the chip; removing the first molding member; removing the second molding member; wherein the first molding member includes a curved surface protruded towards the substrate, the chip or the second molding member.

14 Claims, 11 Drawing Sheets

(56) References Cited

U.S. PATENT DOCUMENTS

| | | | |
|---|---|---|---|
| 2014/0138857 A1* | 5/2014 | Akiba | H01L 21/561 257/791 |
| 2015/0001740 A1* | 1/2015 | Shi | H01L 25/0657 257/784 |
| 2018/0114736 A1* | 4/2018 | Wang | H01L 21/2885 |

* cited by examiner

SEMICONDUCTOR STRUCTURE AND A MANUFACTURING METHOD THEREOF

TECHNICAL FIELD

The present disclosure relates to a semiconductor structure comprising a substrate and chip disposed over the substrate, and a curvature of the substrate is positive or about zero. Further, a method of manufacturing a semiconductor structure comprises disposing a substrate over a curved surface of a molding member, or heating a molding member to a temperature substantially greater than a molding temperature.

DISCUSSION OF THE BACKGROUND

Semiconductor devices are essential for many modern applications. With the advancement of electronic technology, semiconductor devices are becoming smaller and smaller in size while having greater functionality and greater amounts of integrated circuitry. Due to the miniaturized scale of semiconductor devices, wafer level chip scale packaging (WLCSP) is widely used for manufacturing. Numerous manufacturing steps are undertaken in the production of such small semiconductor devices.

However, the manufacturing of semiconductor devices in a miniaturized scale is becoming more complicated. The semiconductor device is assembled with a number of integrated components including various materials with differences in thermal properties. Since many components with different materials are combined, the complexity of the manufacturing operations of the semiconductor device is increased. As such, there is a continuous need to improve the manufacturing process of semiconductor devices and solve the above deficiencies.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides a method of manufacturing a semiconductor structure comprising providing a is substrate and a chip disposed over the substrate; disposing the substrate over a first molding member; disposing a second molding member over the substrate to encapsulate the chip; disposing a molding material around the chip; forming a molding over the substrate and around the chip; removing the first molding member; removing the second molding member, wherein the first molding member includes a curved surface protruded towards the substrate, the chip or the second molding member.

In some embodiments, the substrate is disposed over the curved surface.

In some embodiments, the curved surface is in a convex configuration.

In some embodiments, the curved surface includes a curvature unequal to zero.

In some embodiments, a curvature of the substrate is substantially same as the curvature of the curved surface before the formation of the molding.

In some embodiments, a curvature of the substrate is changed from the curvature of the curved surface to about zero or close to zero after the formation of the molding.

In some embodiments, a curvature of the substrate is unequal to zero before the formation of the molding.

In some embodiments, a curvature of the substrate is about zero or close to zero after the formation of the molding.

In some embodiments, a curvature of the substrate before the formation of the molding is different from the curvature of the substrate after the formation of the molding.

In some embodiments, a curvature of the substrate is decreased after the formation of the molding.

In some embodiments, the substrate is protruded towards the chip or the molding after the formation of the molding.

In some embodiments, the substrate or the chip is curved after the disposing of the substrate over the first molding member.

In some embodiments, the formation of the molding involves a cross-linking reaction.

In some embodiments, the formation of the molding is performed at a molding temperature of about 150° C. to about 200° C.

Another aspect of the present disclosure provides a method of manufacturing a semiconductor structure comprising providing a substrate and a chip disposed over the substrate; providing a first molding member at a first temperature; disposing the substrate over the first molding member; providing a second molding member at a second temperature; disposing the second molding member over the substrate to encapsulate the chip; disposing a molding material around the chip; forming a molding over the substrate and around the chip at a molding temperature; removing the first molding member; removing the second molding member, wherein the first temperature is substantially higher than the molding temperature.

In some embodiments, the first temperature is substantially different from or higher than the second temperature.

In some embodiments, a temperature of the substrate is changed from the first temperature to the molding temperature or close to the molding temperature during the formation of the molding.

In some embodiments, a temperature of the substrate is substantially different from or higher than a temperature of the molding material before the formation of the molding.

In some embodiments, the first temperature is about 150° C. to about 260° C.

Another aspect of the present disclosure provides a semiconductor structure including a substrate; a chip disposed over the substrate; and a molding disposed over the substrate and surrounding the chip at a molding temperature, wherein the warpage of the substrate is convex or about zero at the molding temperature or 10° C. more or less than the molding temperature.

In some embodiments, a curvature of the chip is substantially the same as the curvature of the substrate.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
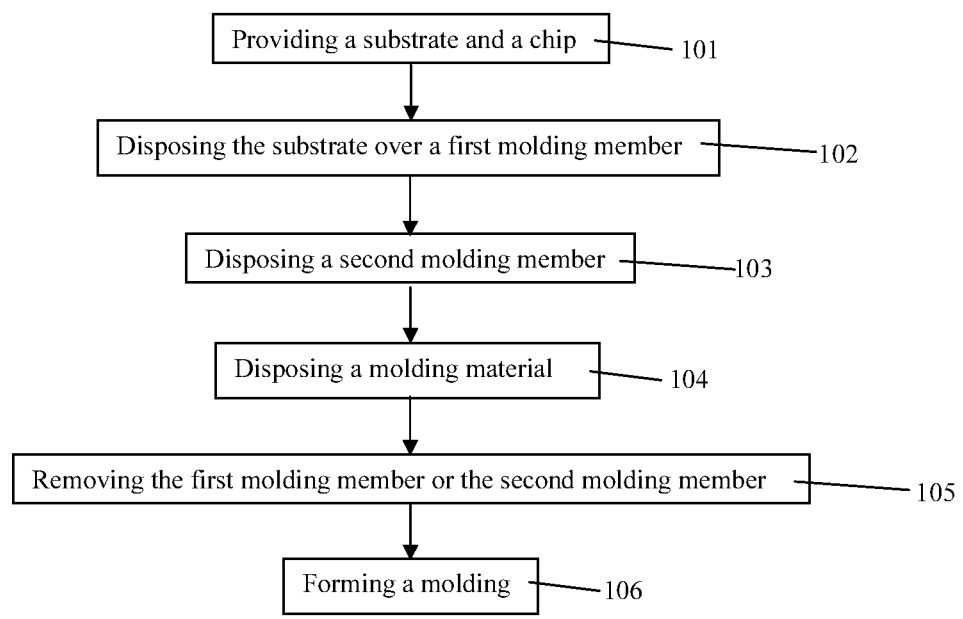
FIG. 1 is a flow chart of a method of manufacturing a semiconductor structure in accordance with some embodiments of the present disclosure.

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a method of manufacturing a semiconductor structure including a molding member having a curved surface or at a temperature substantially greater than a molding temperature. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

A semiconductor structure is manufactured by several processes. A chip is disposed over a substrate and then is encapsulated by a molding. The molding is formed after curing of a molding material. The semiconductor structure including the substrate, the chip and the molding material undergoes thermal processes. Various components are involved in the thermal processes. Different materials may have different coefficients of thermal expansion (CTEs). Unequal CTEs between various components can result in a warpage of the semiconductor structure after the thermal processes. For example, a CTE of the substrate is substantially different from a CTE of the molding, and as such the semiconductor structure may be curved or bent after thermal processes. Since the semiconductor structure is then in a curved configuration, some electrical connectors on the semiconductor structure may not be able to contact or couple with bond pads on another substrate. Cold joints can occur and cause failure of the electrical connection.

In the present disclosure, a method of manufacturing a semiconductor structure is disclosed. The method includes providing a molding member with a curved surface, disposing a substrate over the curved surface, and forming a molding to encapsulate a chip on the substrate. The substrate is curved before the formation of the molding, and a curvature of the substrate can be decreased or even reduced to zero after formation of the molding.

Moreover, another method of manufacturing a semiconductor structure includes providing a molding member at a temperature substantially higher than a molding temperature, disposing a substrate over the molding member, and forming a molding at the molding temperature. A temperature of the substrate is decreased from the temperature of the molding member to the molding temperature. Since the substrate is heated by the molding member before the formation of the molding, reduction in size of the substrate is greater than reduction in size of the molding during the formation of the molding at the molding temperature. In other words, the reduction in size of the molding is compensated by the reduction in size of the substrate. As a result, the substrate is maintained in a flat configuration after the formation of the molding. Any warpage of the substrate is prevented or minimized. Accordingly, reliability of a semiconductor structure can be improved.

In some embodiments, the semiconductor structure can be manufactured by a method 100 of FIG. 1. The method 100 includes a number of operations and the description and illustration are not deemed as a limitation to the sequence of the operations. The method 100 includes a number of steps (101, 102, 103, 104, 105 and 106).

Figure 2:
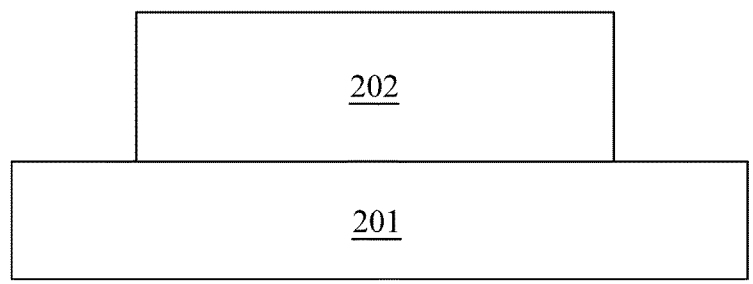
FIGS. 2 to 9 are schematic views of a process of manufacturing the semiconductor structure by the method of FIG. 1 in accordance with some embodiments of the present disclosure.

In step 101, a substrate 201 and a chip 202 are provided or received as shown in FIG. 2. In some embodiments, the substrate 201 is fabricated with a predetermined functional circuit thereon. In some embodiments, the substrate 201 includes several conductive traces and several electrical components disposed within the substrate 201. In some embodiments, the substrate 201 is a semiconductive substrate. In some embodiments, the substrate 201 is a wafer. In some embodiments, the substrate 201 includes semiconductive material such as silicon, germanium, gallium, arsenic, or combinations thereof. In some embodiments, the substrate 201 is a silicon substrate. In some embodiments, the substrate 201 includes material such as ceramic, glass or the like. In some embodiments, the substrate 201 is a glass substrate. In some embodiments, the substrate 201 is in a quadrilateral, rectangular, or square shape.

In some embodiments, the chip 202 is a die or a package. In some embodiments, the chip 202 is a small piece including semiconductor materials such as silicon and is fabricated with a predetermined functional circuit within the chip 202 wherein the functional circuit is formed by photolithography operations. In some embodiments, the chip 202 is singulated from a silicon wafer by a mechanical or laser blade. In some embodiments, the chip 202 is in a quadrilateral, rectangular, or square shape. In some embodiments, the chip 202 includes memories such as Dynamic Random Access Memory (DRAM). In some embodiments, the chip 202 includes a processing unit such as an accelerated processing unit (APU).

In some embodiments, the chip 202 is disposed over the substrate 101. In some embodiments, the chip 202 is attached to a surface of the substrate 101. In some embodiments, the chip 202 is attached to the substrate by an adhesive such as tape, a die attach film (DAF), or the like.

Figure 3:
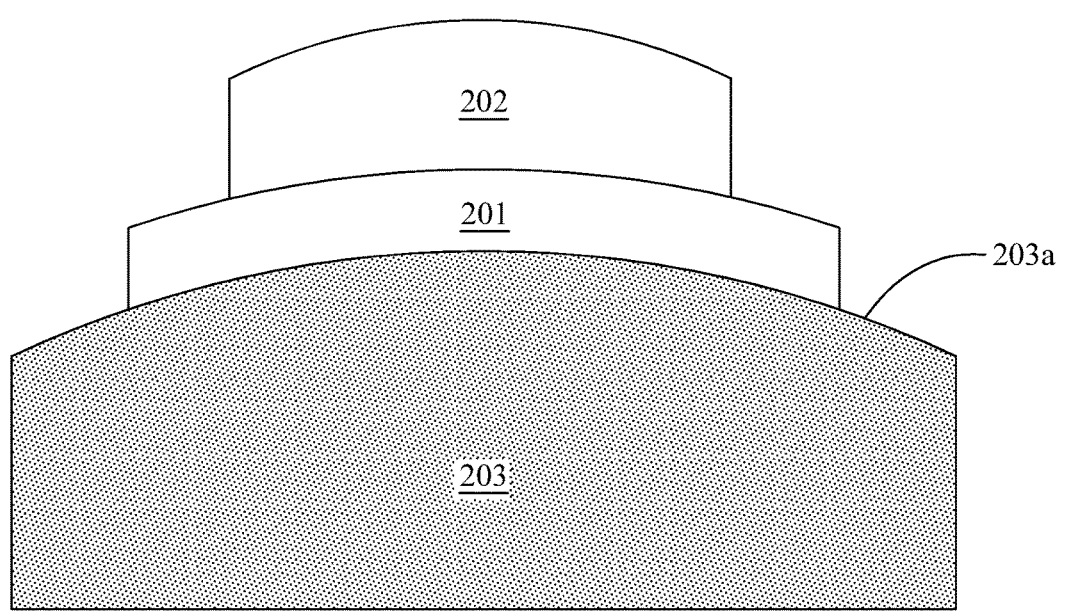

In step 102, a first molding member 203 is provided or received, and the substrate 201 is disposed over the first molding member 203 as shown in FIG. 3. In some embodiments, the substrate 201 is temporarily attached to the first molding member 203 by using vacuum suction. In some embodiments, the first molding member 203 is a part of a mold case for subsequent molding processes. In some embodiments, the first molding member 203 is made of stainless steel or steel with special treatment.

In some embodiments, the first molding member 203 includes a curved surface 203a. In some embodiments, the substrate 201 or the chip 202 is curved after the disposing of the substrate 201 over the first molding member 203. In some embodiments, the substrate 201 is disposed over the curved surface 203a, such that the substrate 201 is in a curved configuration as shown in FIG. 3 after the disposing of the substrate 201 over the first molding member 203. In some embodiments, the chip 202 is also in a curved configuration as shown in FIG. 3 after the disposing of the substrate 201 over the first molding member 203.

In some embodiments, the curved surface 203a is in a convex configuration. In some embodiments, the curved surface 203a includes a curvature unequal to zero. In some embodiments, the curvature of the curved surface 203 is substantially greater than zero (positive curvature). In some embodiments, the substrate 201 includes a curvature unequal to zero. In some embodiments, the curvature of the substrate 201 is also substantially greater than zero as shown in FIG. 3. In some embodiments, the curved surface 203a is protruded towards the substrate 201 or the chip 202, such that the curvature of the curved surface 203a is substantially greater than zero. In some embodiments, the curvature of the substrate 201 is substantially the same as the curvature of the curved surface 203a as shown in FIG. 3.

Figure 4:
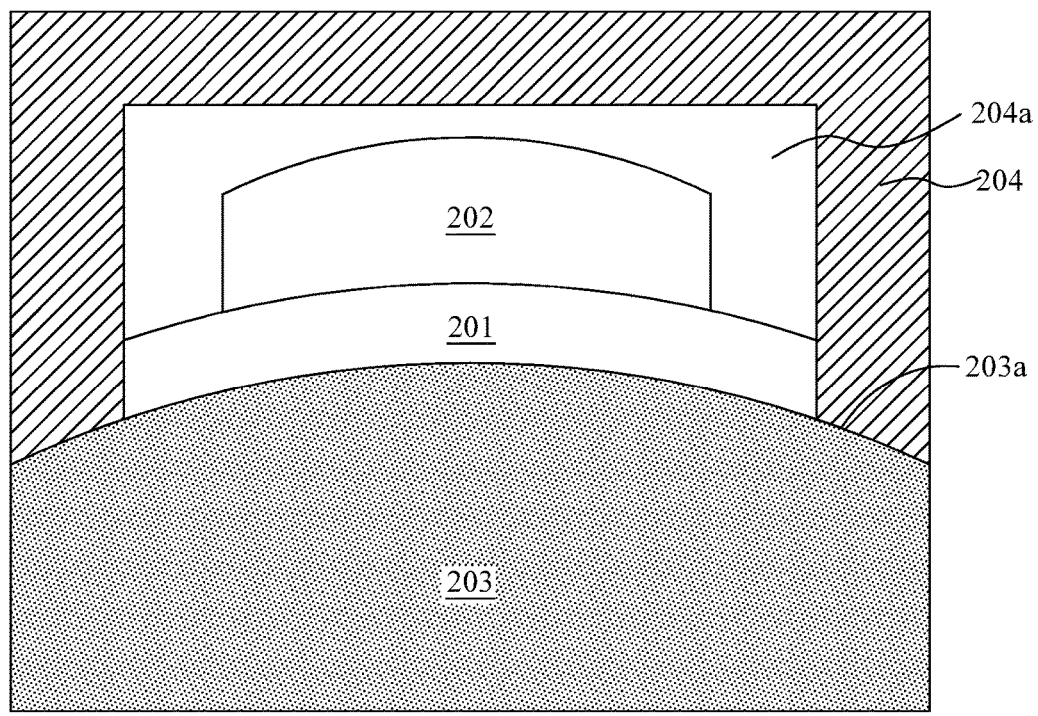

In step 103, a second molding member 204 is provided or received, and the second molding member 204 is disposed over the substrate 201 as shown in FIG. 4. In some embodiments, the second molding member 204 is a part of a mold case for subsequent molding processes. In some embodiments, the second molding member 204 is a mold cap. In some embodiments, the second molding member 204 is made of stainless steel or steel with special treatment.

In some embodiments, the second molding member 204 surrounds the substrate 201 and the chip 202. In some embodiments, the second molding member 204 is disposed over or engaged with the first molding member 203, such that a cavity 204a is formed. In some embodiments, the cavity 204a is defined by the first molding member 203 and the second molding member 204. In some embodiments, the chip 202 is disposed within the cavity 204a. In some embodiments, the chip 202 is encapsulated by the first molding member 203 and the second molding member 204. In some embodiments, the curved surface 203a is protruded towards the second molding member 204 or the cavity 204a.

Figure 5:
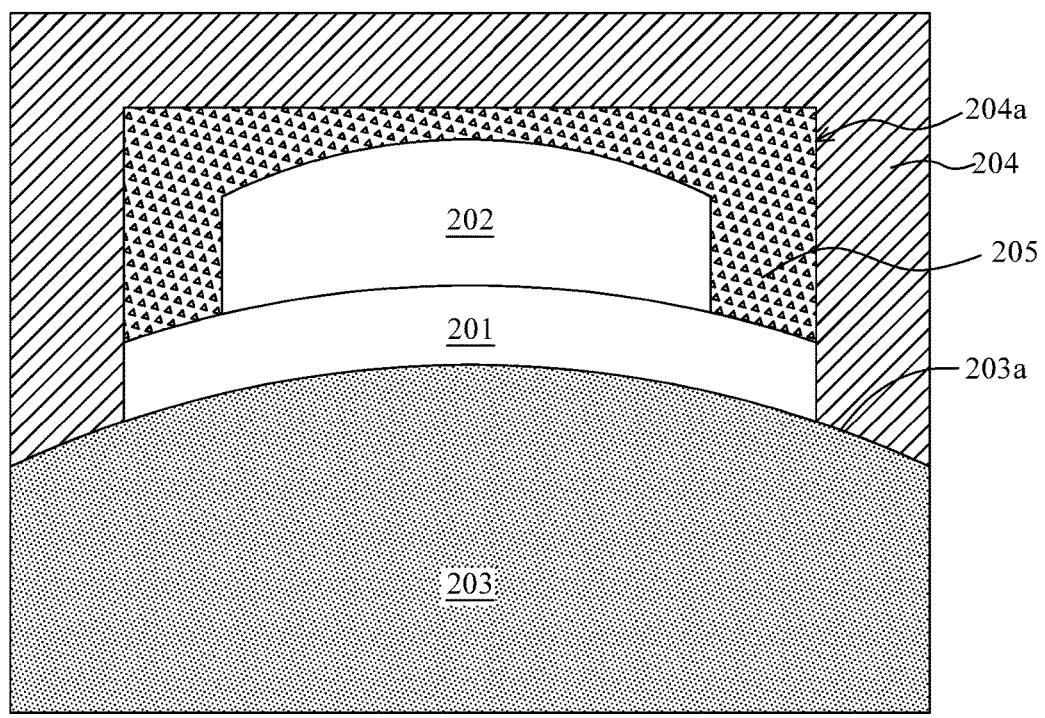

In step 104, a molding material 205 is disposed as shown in FIG. 5. In some embodiments, the molding material 205 is disposed around the chip 202 and over the substrate 201.

In some embodiments, the molding material 205 fills the cavity 204a. In some embodiments, the molding material 205 is a liquid molding compound. In some embodiments, the molding material 205 includes resin, epoxy, or any other suitable material.

In step 105, the first molding member 203 or the second molding member 204 is removed. In some embodiments, the second molding member 204 is removed, and then the first molding member 203 is removed. In some embodiments, the first molding member 203 and the second molding member 204 are removed simultaneously as shown in FIG. 6.

Figure 8:
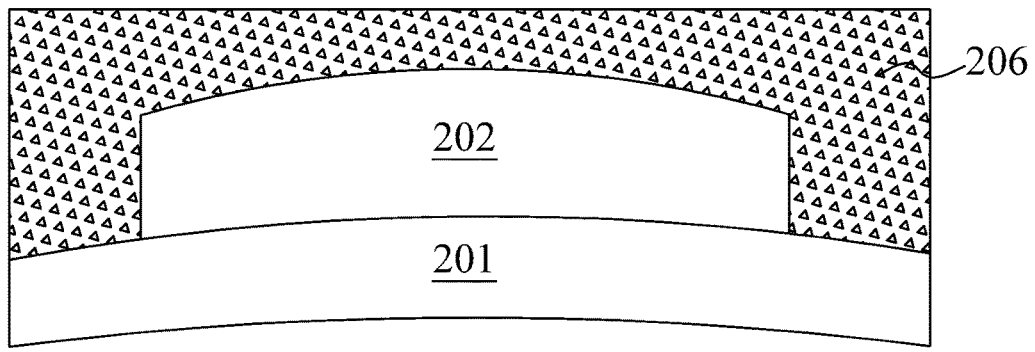
Figure 9:
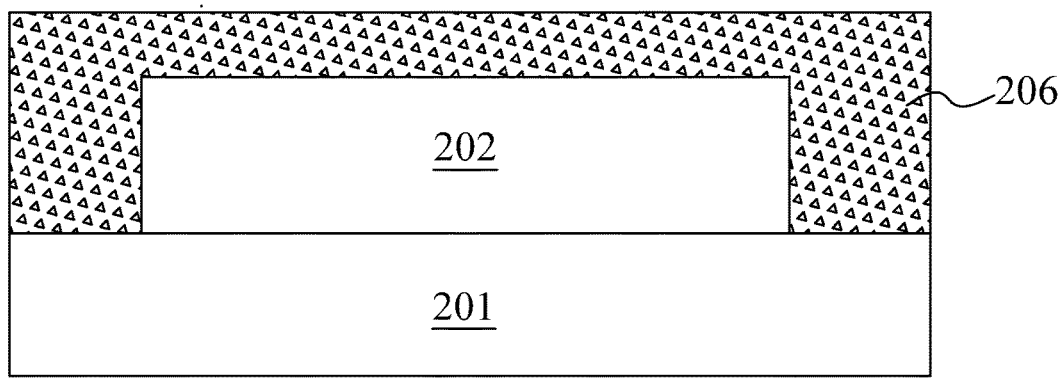

In step 106, a molding 206 is formed as shown in FIG. 8 or 9. In some embodiments, the molding 206 is formed over the substrate 201 and around the chip 202. In some embodiments, the molding material 205 undergoes curing processes to form the molding 206. In some embodiments, the molding material 205 is cured at a molding temperature of about 100° C. to about 300° C. In some embodiments, the molding material 205 is cured at the molding temperature of about 150° C. to about 200° C. In some embodiments, the molding material 205 is cured at the molding temperature of about 175° C.

In some embodiments, the curvature of the substrate 201 is decreased after curing or formation of the molding 206. In some embodiments, the curvature of the substrate 201 is changed from positive curvature to zero curvature. In some embodiments, the molding material 205 undergoes a cross linking reaction, such that the molding material 205 is reduced in size during curing or formation of the molding 206 in a direction along an arrow illustrated in FIG. 7, and the curvature of the substrate 201 is decreased as shown in FIG. 8 or reduced to zero as shown in FIG. 9. In some embodiments, the substrate 201 or the chip is curved after the formation of the molding 206 as shown in FIG. 8.

Figure 6:
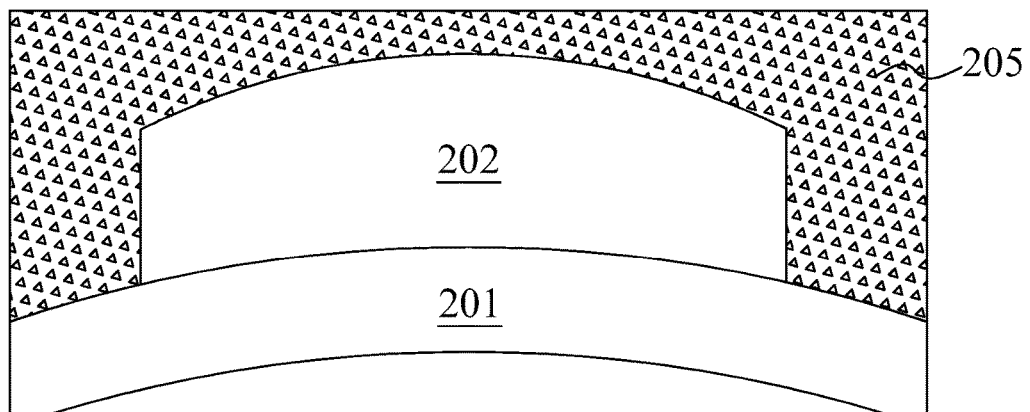
Figure 7:
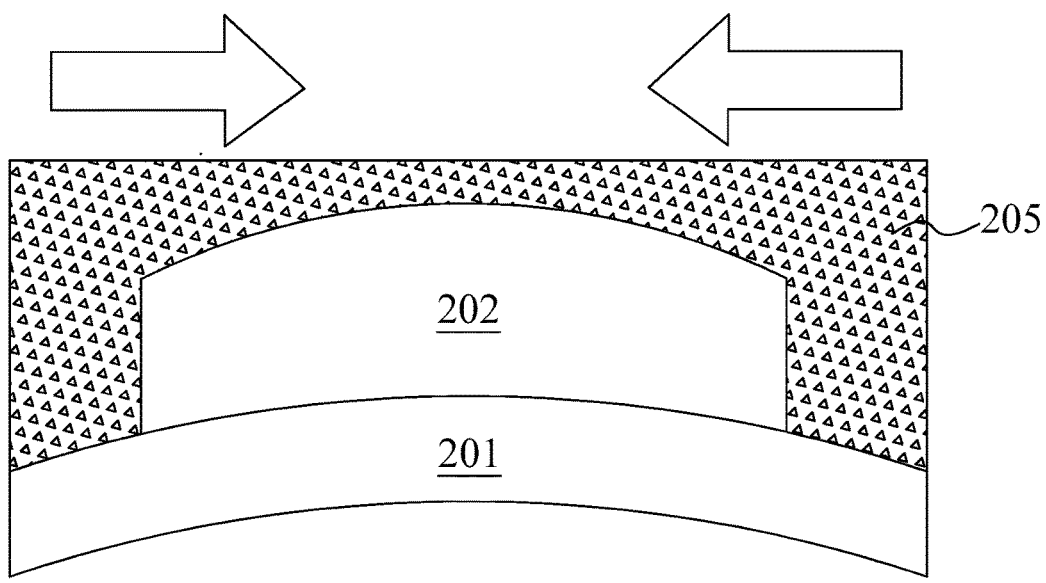

In some embodiments, the curvature of the substrate 201 before the formation of the molding 206 (as illustrated in FIG. 6 or FIG. 7) is substantially greater than or different from the curvature of the substrate 201 after the formation of the molding 206 (as illustrated in FIG. 8 or FIG. 9). In some embodiments, the curvature of the substrate 201 is changed from the curvature of the curved surface 203a (as illustrated in FIG. 6 or FIG. 7) to about zero or close to zero (as illustrated in FIG. 9) after formation of the molding 206. In some embodiments, the curvature of the substrate 201 is about zero or close to zero (as illustrated in FIG. 9) after formation of the molding 206. In some embodiments, the substrate 201 is curved downward as illustrated in FIG. 8 when the molding 206 is formed.

Since the molding material 205 undergoes a cross-linking reaction at the molding temperature, the molding material 205 is reduced in size along a direction towards the chip 202 (as illustrated by the arrow in FIG. 7) during formation of the molding 206. Such reduction in size of the molding material 205 can compensate the curvature or warpage of the substrate 201. As a result, the curvature of the substrate 201 is decreased or becomes zero when the molding 206 is formed.

In some embodiments, a warpage of the substrate 201 is convex or is about zero at the molding temperature or 10° C. more or less than the molding temperature. In some embodiments, the warpage of the substrate 201 is convex when the warpage of the substrate 201 is positive. In some embodiments, the warpage of the substrate 201 is positive when the substrate 201 is curved downward, while the warpage of the substrate 201 is negative when the substrate 201 is curved upward. In some embodiments, a definition of "warpage" is in accordance with JEDEC standard, which is known in the art.

In some embodiments, the step 105 is implemented after the step 106. In some embodiments, the first molding member 203 or the second molding member 204 is removed after the formation of the molding 206.

Figure 10:
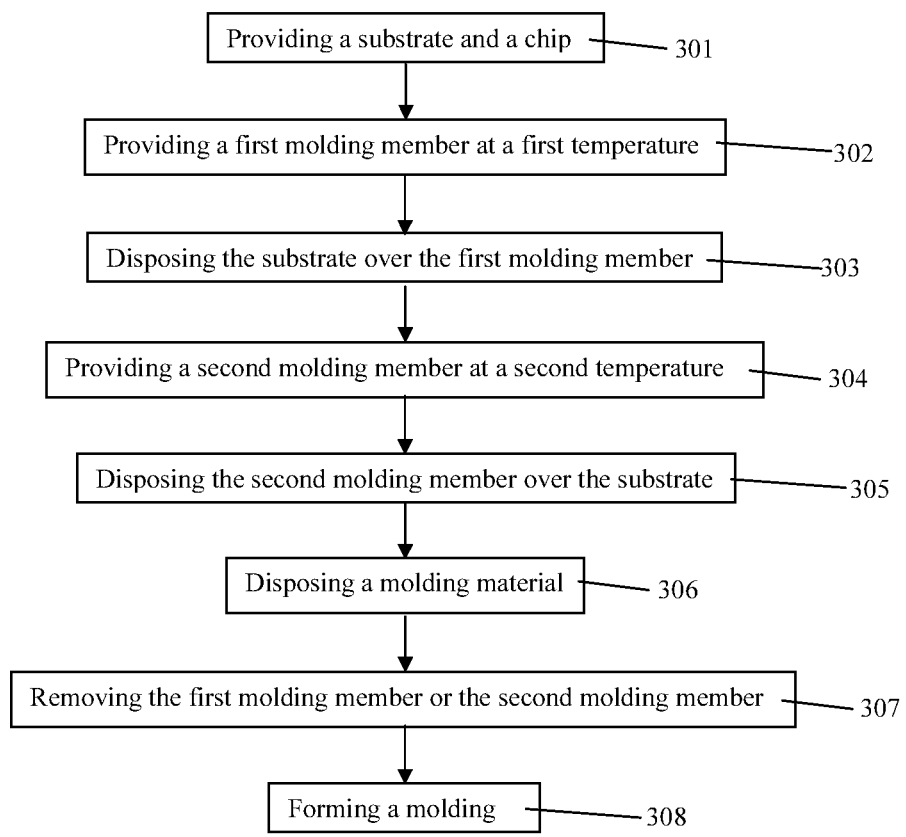
FIG. 10 is a flow chart of a method of manufacturing a semiconductor structure in accordance with some embodiments of the present disclosure.

In some embodiments, the semiconductor structure can be manufactured by a method 300 of FIG. 10. The method 300 includes a number of operations and the description and illustration are not deemed as a limitation to the sequence of the operations. The method 100 includes a number of steps (301, 302, 303, 304, 305, 306, 307 and 308).

Figure 11:
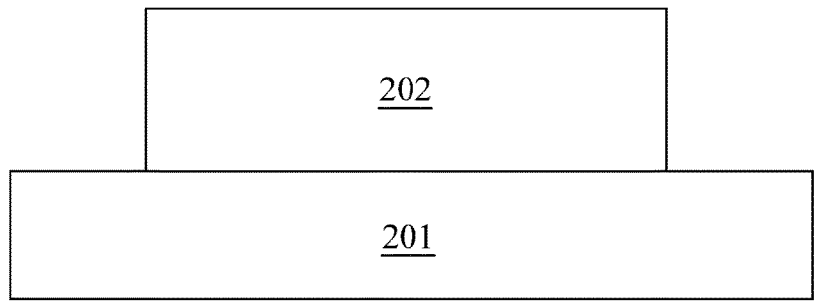
FIGS. 11 to 20 are schematic views of a process of manufacturing the semiconductor structure according to the method of FIG. 10 in accordance with some embodiments of the present disclosure.

In step 301, a substrate 201 and a chip 202 are provided or received as shown in FIG. 11. In some embodiments, the chip 202 is disposed over the substrate 201. In some embodiments, the step 301 is similar to the step 101.

Figure 12:
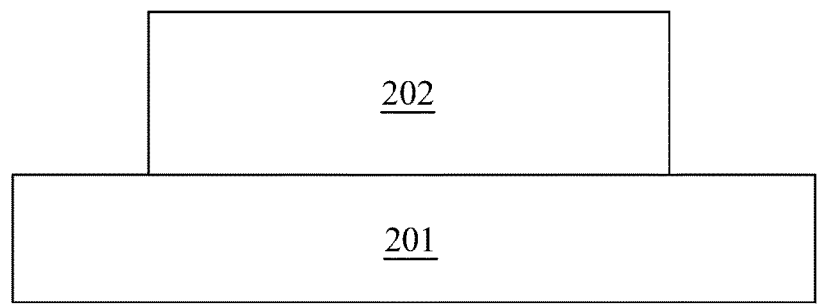
Figure 12:
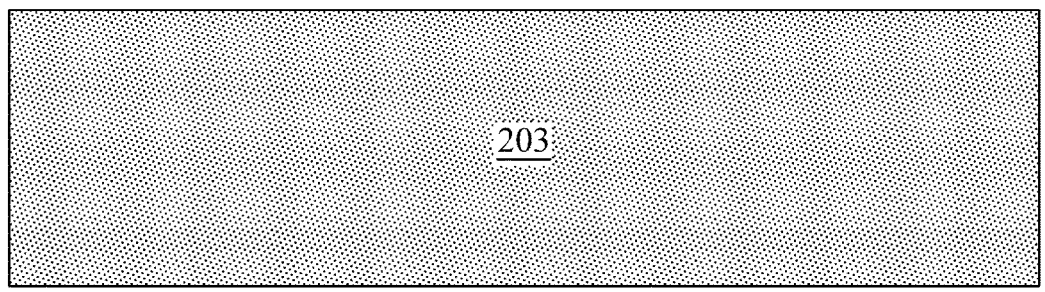

In step 302, a first molding member 203 is provided or received as shown in FIG. 12. In some embodiments, the first molding member 203 is a part of a mold case for subsequent molding processes. In some embodiments, the first molding member 203 at a first temperature is provided. In some embodiments, the first molding member 203 is heated to the first temperature. In some embodiments, the first temperature is substantially higher than a molding temperature, which is a temperature for curing a molding material or forming a molding. In some embodiments, the first temperature is about 150° C. to about 260° C.

Figure 13:
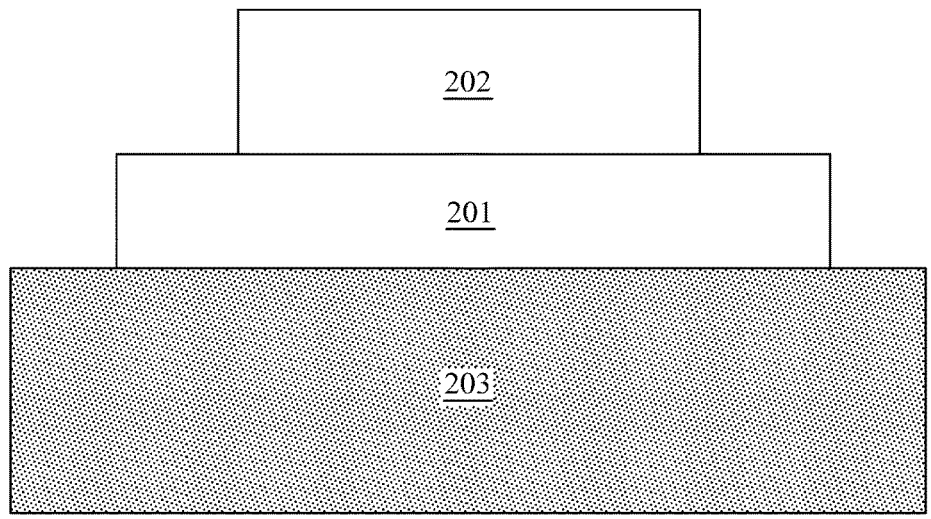

In step 303, the substrate 201 is disposed over the first molding member 203 as shown in FIG. 13. In some embodiments, the substrate 201 and the chip 202 are disposed over the first molding member 203. In some embodiments, the substrate 201 is temporarily attached to the first molding member 203 by using vacuum suction. In some embodiments, the substrate 201 is heated by the first molding member 203 after the disposing of the substrate 201 over the first molding member 203. In some embodiments, the substrate 201 is heated to about the first temperature or a temperature substantially the same as a temperature of the first molding member 203.

Figure 14:
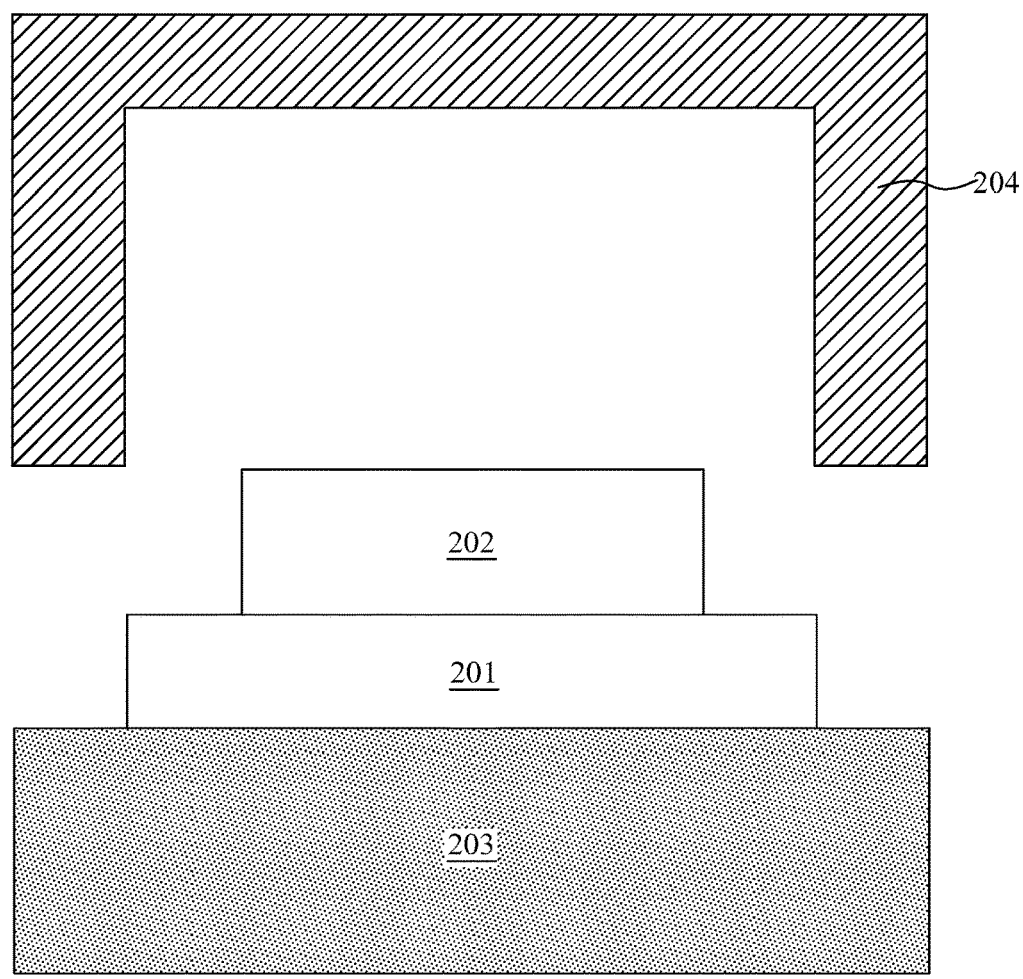

In step 304, a second molding member 204 is provided or received as shown in FIG. 14. In some embodiments, the second molding member 204 is a part of a mold case for subsequent molding processes. In some embodiments, the second molding member 204 is a mold cap. In some embodiments, the second molding member 204 at a second temperature is provided. In some embodiments, the first temperature is substantially different from the second temperature. In some embodiments, the first temperature is substantially higher than the second temperature. In some embodiments, the second temperature is about 150° C. to about 200° C.

Figure 15:
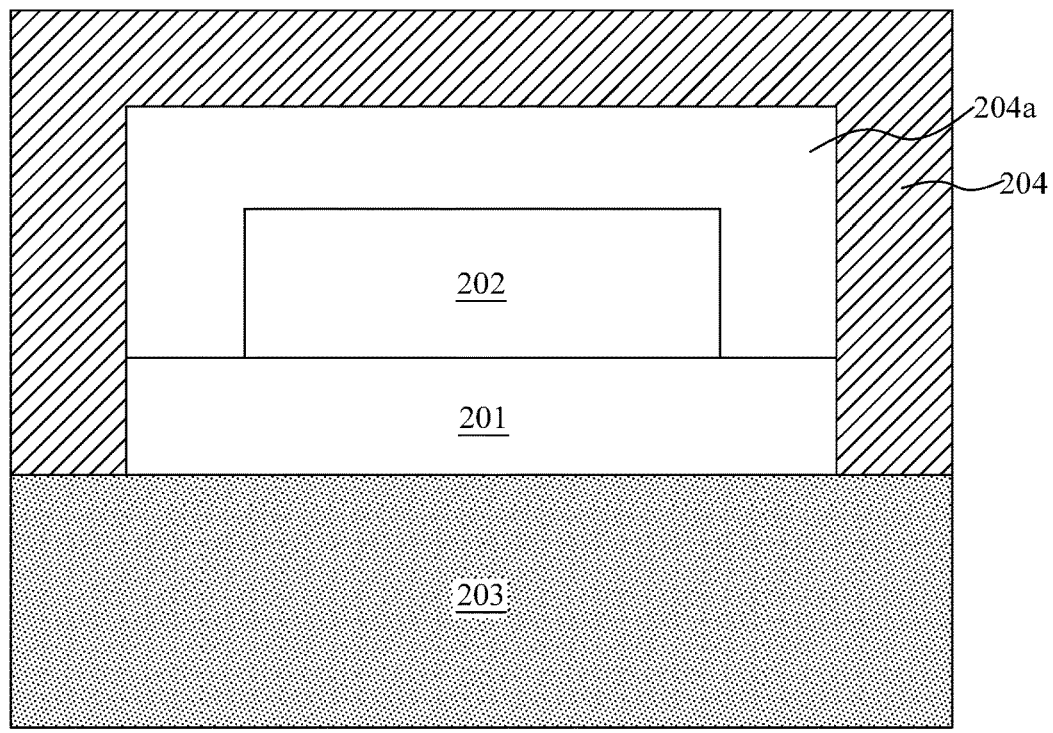

In step 305, the second molding member 204 is disposed over the substrate 201 to encapsulate the chip 202 as shown in FIG. 15. In some embodiments, the second molding member 204 surrounds the substrate 201 and the chip 202. In some embodiments, the second molding member 204 is disposed over or engaged with the first molding member 203, such that a cavity 204a is formed. In some embodiments, the cavity 204a is defined by the first molding member 203 and the second molding member 204. In some embodiments, the chip 202 is disposed within the cavity 204a. In some embodiments, the chip 202 is encapsulated by the first molding member 203 and the second molding member 204.

Figure 16:
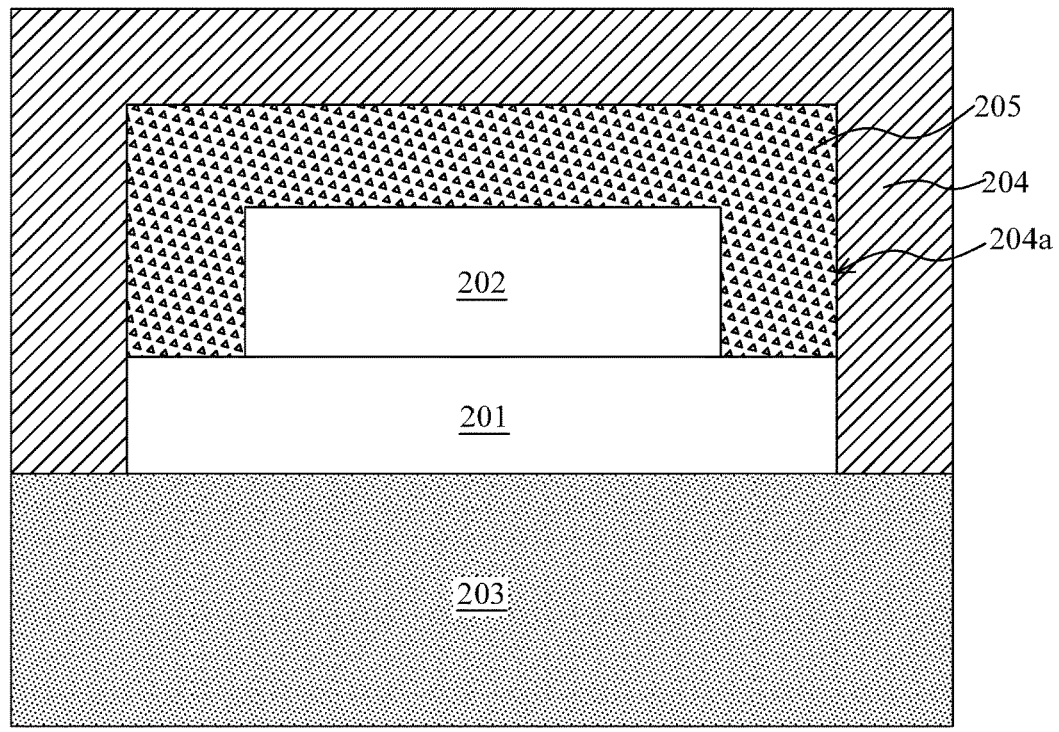

In step 306, a molding material 205 is disposed around the chip 202 and over the substrate 201 as shown in FIG. 16. In some embodiments, the chip 202 is surrounded by the molding material 205. In some embodiments, the step 306 is similar to the step 104.

Figure 17:
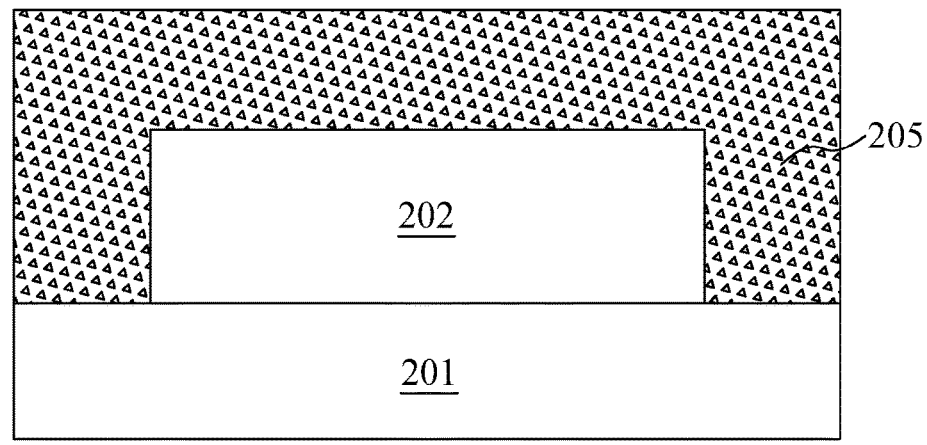

In step 307, the first molding member 203 or the second molding member 204 is removed as shown in FIG. 17. In some embodiments, the step 307 is similar to the step 105.

Figure 18:
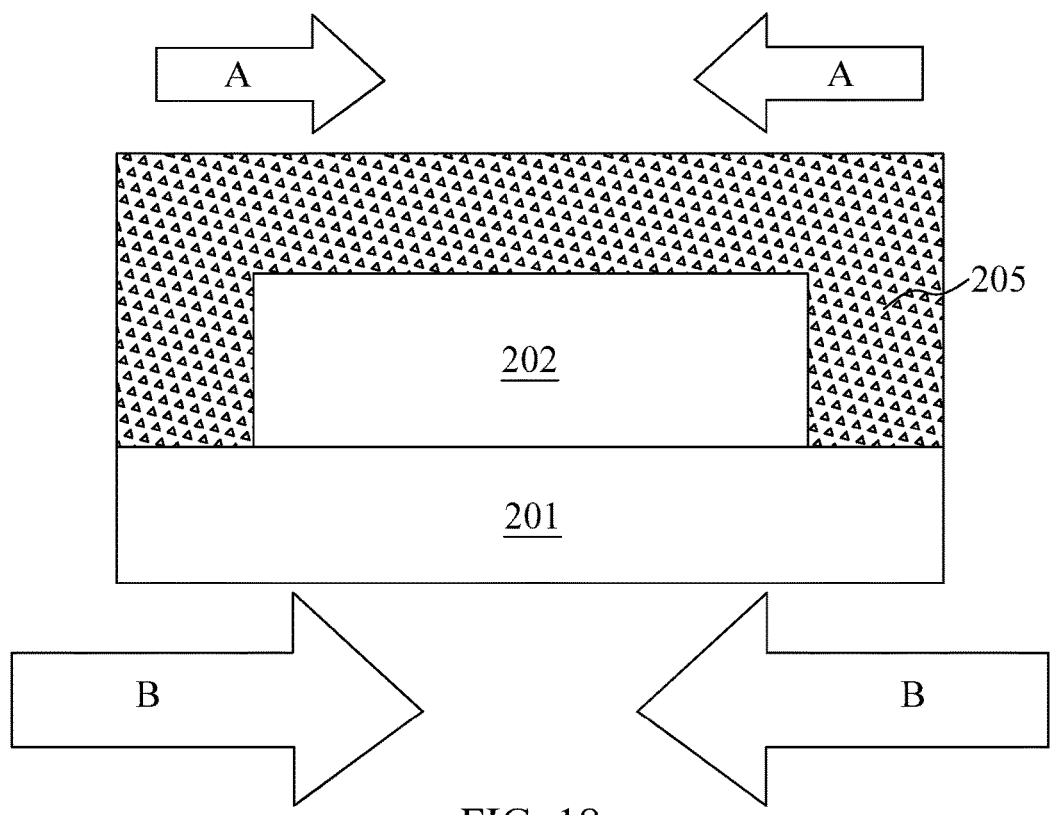
Figure 19:
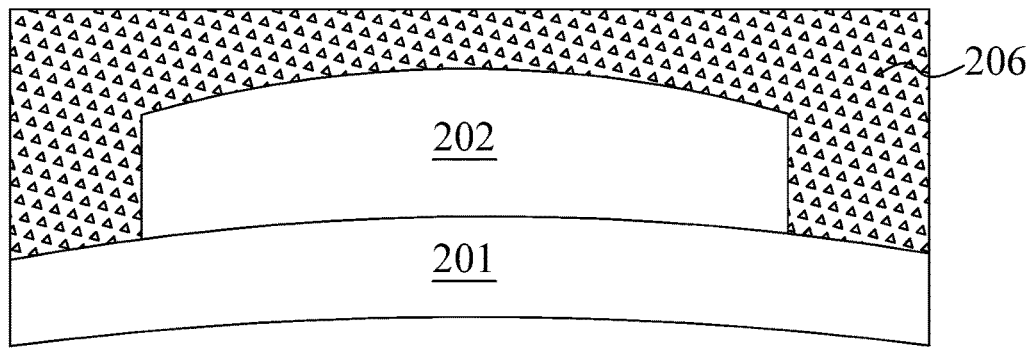
Figure 20:
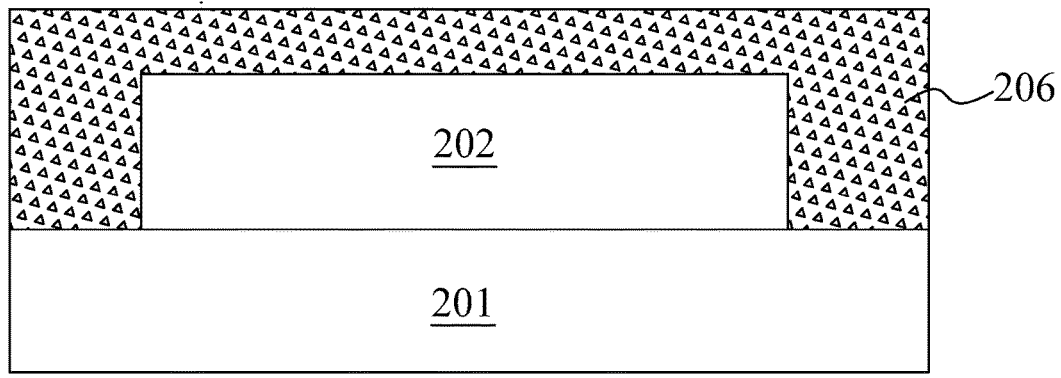

In step 308, a molding 206 is formed as shown in FIG. 19 or FIG. 20. In some embodiments, the molding 206 is formed over the substrate 201 and around the chip 202. In some embodiments, the molding material 205 as shown in FIG. 18 becomes the molding 206 as shown in FIG. 19 or FIG. 20 at a molding temperature. In some embodiments, the molding material 205 undergoes curing processes to form the molding 206. In some embodiments, the molding material 205 is cured at the molding temperature. In some embodiments, the molding temperature is about 100° C. to about 300° C. In some embodiments, the molding material 205 is cured at the molding temperature of about 150° C. to about 200° C. In some embodiments, the molding material 205 is cured at the molding temperature of about 175° C. In some embodiments, the first temperature is substantially higher than the molding temperature. In some embodiments, the temperature of the substrate 201 is substantially different from or higher than a temperature of the molding material 205 before formation of the molding 206.

In some embodiments, the temperature of the substrate 201 is changed from the first temperature to the molding temperature or close to the molding temperature during curing of the molding material 205 or formation of the molding 206. In some embodiments, the substrate 201 is cooled down from the first temperature to the molding temperature. Such temperature change or cooling of the substrate 201 causes a reduction in size of the substrate 201. In some embodiments, the substrate 201 is reduced in size in a direction along an arrow B as illustrated in FIG. 18.

In some embodiments, the molding material 205 undergoes a cross-linking reaction at the molding temperature, such that the molding material 205 is reduced in size during curing or formation of the molding 206 in a direction along an arrow A as illustrated in FIG. 18. In some embodiments, a degree of reduction in size of the substrate 201 is substantially greater than the reduction in size of the molding material 205, and as a result the substrate 201 becomes curved as shown in FIG. 19. In some embodiments, a curvature of the substrate 201 is unequal to or substantially greater than zero. In some embodiments, the substrate 201 is curved downward.

In some embodiments, a degree of reduction in size of the substrate 201 is substantially the same as a reduction in size of the molding material 205. As such, the reduction in size of the molding material 205 caused by the cross-linking reaction can be compensated by the reduction in size of the substrate 201 caused by the temperature change of the substrate 201 from the first temperature to the molding temperature. As a result, the curvature of the substrate 201 can be maintained at zero after formation of the molding 206.

In some embodiments, the step 307 is implemented after the step 308. In some embodiments, the first molding member 203 or the second molding member 204 is removed after the formation of the molding 206.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method of manufacturing a semiconductor structure, comprising:
    providing a substrate and a chip disposed over the substrate;
    disposing the substrate over a first molding member;
    disposing a second molding member over the substrate to encapsulate the chip;
    disposing a molding material around the chip;
    forming a molding over the substrate and around the chip;
    removing the first molding member;
    removing the second molding member,
    wherein the first molding member includes a curved surface protruded towards the substrate, the chip or the second molding member,
    wherein the substrate or the chip is curved to match a curvature of the curved surface of the first molding member before disposing the molding material, and
    wherein the substrate and the chip are entirely encapsulated by the first molding member and the second molding member before disposing the molding material.

2. The method of claim 1, wherein the substrate is disposed over the curved surface.

3. The method of claim 1, wherein the curved surface is in a convex configuration.

4. The method of claim 1, wherein the curved surface includes a curvature unequal to zero.

5. The method of claim 4, wherein a curvature of the substrate is substantially the same as the curvature of the curved surface before the formation of the molding.

6. The method of claim 4, wherein a curvature of the substrate is changed from the curvature of the curved surface to about zero or close to zero after the formation of the molding.

7. The method of claim 1, wherein a curvature of the substrate is unequal to zero before the formation of the molding.

8. The method of claim 1, wherein a curvature of the substrate is about zero or close to zero after the formation of the molding.

9. The method of claim 1, wherein a curvature of the substrate before the formation of the molding is different from the curvature of the substrate after the formation of the molding.

10. The method of claim 1, wherein a curvature of the substrate is decreased after the formation of the molding.

11. The method of claim 1, wherein the substrate is protruded towards the chip or the molding after the formation of the molding.

12. The method of claim 1, wherein the substrate or the chip is curved after the disposing of the substrate over the first molding member.

13. The method of. claim 1, wherein the formation of the molding involves a cross-linking reaction.

14. The method of claim 1, wherein the formation of the molding is performed at a molding temperature of about 150° C. to about 200° C.

* * * * *